US008685623B2

(12) United States Patent
Rondon et al.

(10) Patent No.: US 8,685,623 B2

(45) Date of Patent: *Apr. 1, 2014

(54) LITHOGRAPHIC IMAGING AND PRINTING WITHOUT DEFECTS OF ELECTROSTATIC ORIGIN

(71) Applicants: Sonia Rondon, Nashua, NH (US); Kevin Ray, Windham, NH (US)

(72) Inventors: Sonia Rondon, Nashua, NH (US); Kevin Ray, Windham, NH (US)

(73) Assignee: Presstek, Inc., Hudson, NH (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/750,546

(22) Filed: Jan. 25, 2013

(65) Prior Publication Data

US 2013/0160667 A1 Jun. 27, 2013

Related U.S. Application Data

(62) Division of application No. 12/697,536, filed on Feb. 1, 2010.

(51) Int. Cl.

| | |
|---|---|
| ***B41N 1/00*** | (2006.01) |
| ***G03F 7/00*** | (2006.01) |
| ***G03F 7/26*** | (2006.01) |
| ***B41M 5/00*** | (2006.01) |

(52) U.S. Cl.

USPC ..... 430/302; 101/450.1; 101/453; 101/463.1; 430/270.1; 430/271.1; 430/273.1; 430/294

(58) Field of Classification Search

USPC .................... 430/306; 101/450.1, 463, 463.1

See application file for complete search history.

(56) References Cited

U.S. PATENT DOCUMENTS

| | | | | |
|---|---|---|---|---|
| 5,339,737 | A | 8/1994 | Lewis et al. | |
| 5,487,338 | A | 1/1996 | Lewis et al. | |
| 5,632,204 | A | 5/1997 | Lewis | |
| 5,704,291 | A | 1/1998 | Lewis | |
| 6,055,906 | A | 5/2000 | Lewis | |
| 6,242,156 | B1 * | 6/2001 | Teng | 430/270.1 |
| 6,245,486 | B1 * | 6/2001 | Teng | 430/303 |
| 2003/0228540 | A1 * | 12/2003 | Goto et al. | 430/272.1 |
| 2011/0236705 | A1 | 9/2011 | Melamed et al. | |

OTHER PUBLICATIONS

International Search Report and Written Opinion mailed Apr. 28, 2011 for International Application No. PCT/US2011/023130 (8 pages).

* cited by examiner

*Primary Examiner* — Chanceity Robinson

(74) *Attorney, Agent, or Firm* — Bingham McCutchen LLP

(57) ABSTRACT

Embodiments of the present invention involve three-layer printing members having a central layer that is non-conductive yet abalatable at commercially realistic fluence levels. In various embodiments, the central layer is polymeric with a dispersion of nonconductive carbon black particles therein at a loading level sufficient to provide at least partial layer ablatability and water compatibility of the resulting ablation debris.

11 Claims, 2 Drawing Sheets

LITHOGRAPHIC IMAGING AND PRINTING WITHOUT DEFECTS OF ELECTROSTATIC ORIGIN

RELATED APPLICATIONS

This application is a divisional of and claims priority to U.S. Ser. No. 12/697,536, filed on Feb. 1, 2010, the disclosure of which is hereby incorporated by reference in its entirety.

BACKGROUND OF THE INVENTION

In offset lithography, a printable image is present on a printing member as a pattern of ink-accepting (oleophilic) and ink-rejecting (oleophobic) surface areas. Once applied to these areas, ink can be efficiently transferred to a recording medium in the imagewise pattern with substantial fidelity. In a wet lithographic system, the non-image areas are hydrophilic, and the necessary ink-repellency is provided by an initial application of a dampening fluid to the plate prior to inking. The dampening fluid prevents ink from adhering to the non-image areas, but does not affect the oleophilic character of the image areas. Ink applied uniformly to the wetted printing member is transferred to the recording medium only in the imagewise pattern. Typically, the printing member first makes contact with a compliant intermediate surface called a blanket cylinder which, in turn, applies the image to the paper or other recording medium. In typical sheet-fed press systems, the recording medium is pinned to an impression cylinder, which brings it into contact with the blanket cylinder.

To circumvent the cumbersome photographic development, plate-mounting, and plate-registration operations that typify traditional printing technologies, practitioners have developed electronic alternatives that store the imagewise pattern in digital form and impress the pattern directly onto the plate. Plate-imaging devices amenable to computer control include various forms of lasers. Three-layer plates, for example, are made ready for press use by image-wise exposure to imaging (e.g., infrared or "IR") radiation that causes ablation of all or part of the central layer, destroying the bonding to the overlying (typically polymer) layer in the exposed areas. This may involve complete ablation of the central layer or ablation of its upper region.

Subsequently, the de-anchored overlying layer and the central layer are removed (at least partially) by a post-imaging cleaning process—e.g., rubbing of the plate with or without a cleaning liquid—to reveal the third layer (typically an oleophilic polymer, such as polyester). If the central layer is metal (e.g., a very thin layer of titanium), the entire layer will be ablated, and the final printing member will feature unexposed polymer areas over metal and the underlying polymer layer (or layers). If the central layer is polymeric, partial (but de-anchoring) ablation of the layer can be tolerated under either of two conditions: the remainder of the layer is removed by cleaning, or the central layer is oleophilic (so persistence of some portion of that layer, even after cleaning, does not affect the plate's lithographic performance). The edges of the printing member may be pinned to a plate cylinder by metal clamps, which, due to their mechanical association with the press, are electrically grounded.

This type of plate structure has a tendency to undergo triboelectric charging during printing due to repetitive cycles of contact with and separation from the press form rollers (which, like the topmost polymer plate layer, are made of insulating material). Because the clamps provide a ground path, electrostatic charge accumulating on regions of the plate held by clamps dissipates or never develops. But unimaged islands within the plate, which have both polymer and metal layers, are electrically isolated from the clamps. As a result, the accumulated charge is trapped in these regions. The charge build-up is cumulative and therefore increases as a function of the speed of the printing process. (See, e.g., U.S. Pat. No. 6,055,906, the entire disclosure of which is hereby incorporated by reference.)

Under standard press operation conditions the static charge can build up rapidly and create high-voltage differences between the different areas of the printing member. The latter can lead to electrostatic discharge ("ESD") events, when sudden and uncontrolled transfer of static charge occurs. The electrostatic energy is converted into heat that can cause severe damage to the fine features of an imaged plate, leading to unacceptable print-work.

In a waterless press (in which the printing member has, for example, a silicone topmost layer), the static charge accumulation and/or dissipation can be partially controlled by, for example, increasing the relative humidity of the room; using form rollers made of materials close to silicone in the triboelectric series; and/or using air-ionizing bars. These solutions are cumbersome and expensive, and frequently unrealistic in a commercial printing environment.

SUMMARY OF THE INVENTION

Embodiments of the present invention involve three-layer printing members having a central layer that is non-conductive but at least partially abalatable at commercially realistic fluence levels. In various embodiments, the central layer is polymeric with a dispersion therein of nonconductive carbon black particles at a loading level sufficient to provide layer ablatability.

Accordingly, in a first aspect, the invention relates to a lithographic printing member comprising a first layer presenting a hydrophilic or oleophobic lithographic affinity; a second layer comprising a polymeric matrix and, dispersed therein, nonconductive carbon black particles at a loading level sufficient to provide water compatibility and at least partial layer ablatability and water compatibility of ablation debris; and a third layer presenting an oleophilic lithographic affinity. The second layer is disposed between the first and third layers. In dry-plate embodiments, the first layer may comprise or consist essentially of a silicone or fluorocarbon, whereas in wet-plate embodiments, the first layer may comprise or consist essentially of a polyvinyl alcohol. The third layer may be a polyester substrate or other oleophilic polymeric layer, or may instead be a metal layer. Even if polymeric, the third layer may be thick or sturdy enough to function as a substrate, or may instead be attached (e.g., laminated) to a metal sheet for dimensional stability.

Preferably, ablation debris generated by imaging the second layer is removable by contact with an aqueous liquid, i.e., it is water-compatible. The loading level may be sufficient to confer ablatability at a fluence of 400 $mJ/cm^2$ or less, and more preferably at a fluence of 300 $mJ/cm^2$ or less. The carbon loading level may be at least 25 wt %, although in various embodiments, it is at least 35 or 40 wt %. The second layer may have a dry coating weight of at least 0.2 $g/m^2$, or at least 0.4 $g/m^2$, or at least 0.8 $g/m^2$, or at least 1.0 $g/m^2$, or in some embodiments, at least 1.5 $g/m^2$.

In another aspect, the invention pertains to a method of forming an imagable lithographic printing member. In various embodiments, the method comprises applying, to an ink-receptive layer, an imaging layer comprising a polymeric matrix and, dispersed therein, nonconductive carbon black particles at a loading level sufficient to provide at least partial layer ablatability and water compatibility of ablation debris. The imaging layer is then dried (and/or cured). To the finished imaging layer is applied a topmost coating which, when dried or cured, presents a hydrophilic or oleophobic lithographic affinity, and this layer, too, is dried (and/or cured).

Another aspect of the invention involves a method of imaging a lithographic printing member. In various embodiments, the method utilizes a lithographic printing member comprising (i) a first layer presenting a hydrophilic or oleophobic lithographic affinity, (ii) a second layer comprising a polymeric matrix and, dispersed therein, nonconductive carbon black particles at a loading level sufficient to provide at least partial layer ablatability, and (iii) a third layer presenting an oleophilic lithographic affinity (with the second layer disposed between the first and third layers). The printing member is exposed to imaging radiation in an imagewise pattern so as to ablate the second layer where exposed. Thereafter, the printing member is subjected to an aqueous liquid to remove imaged portions of the imaging layer, including ablation debris of the second layer, thereby creating an imagewise lithographic pattern on the printing member.

The aqueous liquid may consist essentially of water, e.g., it may be plain tap water. Alternatively, the aqueous liquid may comprise water and a component that eases the removal and silicone and carbon debris, facilitating faster and more efficient cleaning. For example, the aqueous liquid may include not more than 20% (or not more than 15%) by weight of an organic solvent, e.g., an alcohol, and the alcohol may be a glycol (e.g., propylene glycol), benzyl alcohol and/or phenoxyethanol. Alternatively or in addition, the aqueous liquid may comprise a surfactant. The aqueous liquid may be heated to a temperature greater than about 80° F.

Still another aspect of the invention involves a method of lithographic printing. In various embodiments, the method utilizes a lithographic printing member comprising (i) a first layer presenting an oleophobic lithographic affinity, (ii) a second layer comprising a polymeric matrix and, dispersed therein, nonconductive carbon black particles at a loading level sufficient to provide water compatibility and at least partial layer ablatability, and (iii) a third layer presenting an oleophilic lithographic affinity (where the second layer is disposed between the first and third layers). The printing member is exposed to imaging radiation in an imagewise pattern so as to at least partially ablate the second layer where exposed and thereby de-anchor the first layer. Thereafter, the printing member is subjected to an aqueous liquid to remove imaged portions of the imaging layer, thereby creating an imagewise lithographic pattern on the printing member. Following the removal step, the printing member is used in a printing press—i.e., ink is applied to the printing member (and adheres only to imaged portions of the printing member) and transferred from the printing member to a recording medium. The applying and transferring step occur without deleterious buildup of triboelectric charge (where "deleterious buildup" means, in this context, sufficient charge to create a visible defect in the printed copy).

It should be stressed that, as used herein, the term "plate" or "member" refers to any type of printing member or surface capable of recording an image defined by regions exhibiting differential affinities for ink and/or fountain solution. Suitable configurations include the traditional planar or curved lithographic plates that are mounted on the plate cylinder of a printing press, but can also include seamless cylinders (e.g., the roll surface of a plate cylinder), an endless belt, or other arrangement.

The term "hydrophilic" is used in the printing sense to connote a surface affinity for a fluid which prevents ink from adhering thereto. Such fluids include water for conventional ink systems, aqueous and non-aqueous dampening liquids, and the non-ink phase of single-fluid ink systems. Thus, a hydrophilic surface in accordance herewith exhibits preferential affinity for any of these materials relative to oil-based materials.

"Ablation" of a layer means either rapid phase transformation (e.g., vaporization) or catastrophic thermal overload, resulting in uniform layer decomposition. Typically, decomposition products are primarily gaseous. Optimal ablation involves substantially complete thermal decomposition (or pyrolysis) with limited melting or formation of solid decomposition products.

DESCRIPTION OF DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

1. Problem Addressed by the Present Invention

Figure 1A:
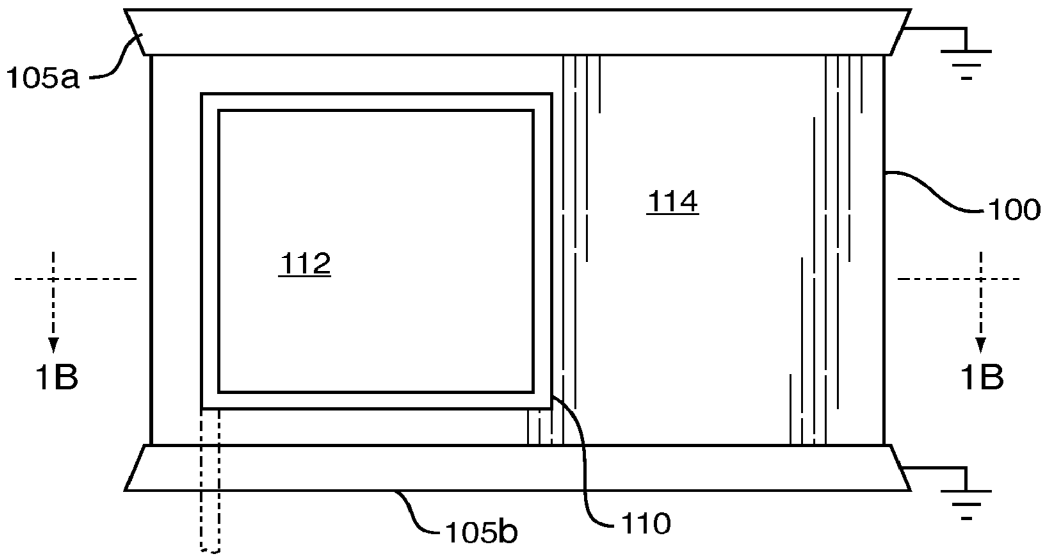
FIG. 1A is a plan schematic illustration of a printing plate having a floating region vulnerable to charge buildup.

Refer first to FIG. 1, which illustrates the problem addressed by the present invention. A prior-art printing plate 100 is pinned, by means of a pair of end clamps 105*a*, 105*b*, to the plate cylinder of a printing press or a platesetter. End clamps 105 are grounded through mechanical connection to the machine frame. Printing plate 100 is imaged by ablation using imaging apparatus as described below.

The prior-art plate 100 has been imaged so as to produce a thin, frame-like image area 110. This area encloses an unimaged region 112, and is surrounded by a larger unimaged region 114 in electrical contact with both clamps 105*a*, 105*b*. As a result, when the plate 100 is used to print, ink is received only by image area 110, and the printed copy is a replica of this area.

Figure 1B:
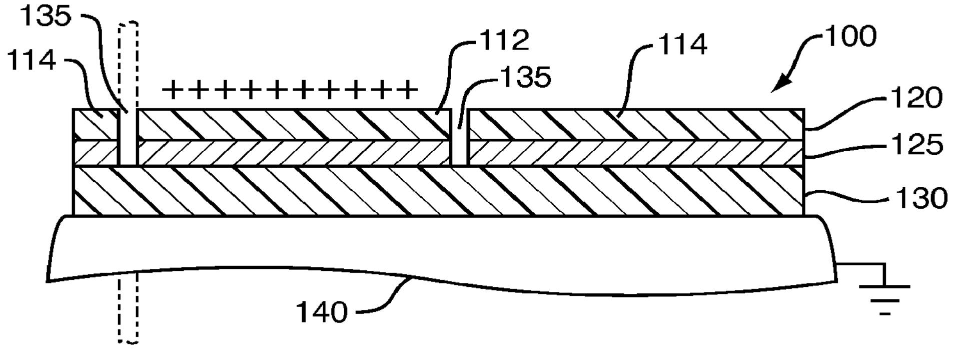
FIG. 1B is an elevational section taken along the line 1B-1B, showing how charge can build up in the floating region.
Figure 1C:
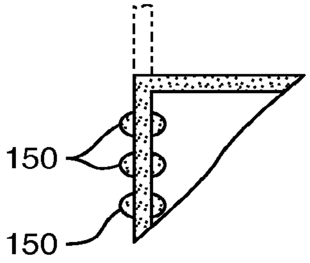
FIG. 1C illustrates the type of printing defect that can result.

FIG. 1B shows a cross-section of plate 100 through the imaged region 110. The plate itself is a three-layer construction having a topmost layer 120 chosen for its lithographic affinity; a metal ablation layer 125, which is selectively destroyed by imaging radiation; and a substrate 130 whose lithographic affinity is opposite to that of the layer 120. For example, topmost layer 120 may be silicone; ablation layer 125 may be titanium; and substrate 130 may be polyester, all in accordance with the U.S. Pat. No. Re. 33,512 ("the '512 patent"). The result is a dry plate whose silicone surface 120 repels ink.

Where the plate 100 has been imaged to reveal layer 130, the plate accepts ink; the imaged regions appear as slot-like gaps 135. Removal of layer 120 above areas of layer 125 that have been destroyed may entail a post-imaging cleaning process (e.g., rubbing with or without a cleaning liquid as described, for example, in the '737 and '512 patents and in U.S. Pat. No. 5,378,580). Substrate 130 is in contact with a drum or plate cylinder 140, which, like clamps 105, is at ground potential.

Imaging and/or cleaning of plate 100 results in triboelectric charging—which may be negative or, as illustrated, positive—of region 112, which is electrically isolated from the remainder 114 of layer 120 (and, hence, grounded clamps 105). Electrostatic charge buildup can also occur during printing, i.e., as ink is transferred to and from plate 110 on a press. Electrostatic charge does not accumulate on region 114 because of the contact with clamps 105.

If layers 120, 130 are nonconductive, dielectric materials, region 112 behaves as a capacitor. The larger the area of region 112, the more charge it can accumulate, and the greater will be the potential difference between region 112 and ground. If this voltage is large enough and image area 110 thin enough (or, with reference to FIG. 1B, if gaps 135 are narrow enough), the charge can arc from region 112 to area 114 (i.e., across gaps 135). Arcing results in destruction of a small additional portion of layer 120 in the region of the arc, producing a widening or puckering the image region 110. The affected areas accept ink although they were not imaged by the laser, and manifest themselves as a series of visible defects 150 (see FIG. 1C) that mark where arcing occurred.

Obviously the depicted configuration represents a highly simplified plate image, but similar defects can occur even in more detailed image patterns. For example, the contents of area 114 are essentially irrelevant to the accumulation of static charge on area 112, and arcing can occur wherever the image area 110 narrows sufficiently. The factors that favor defects 150 are a large, electrically isolated area 112, a sufficiently thin image region 110, and adjacent regions having path to ground.

2. Printing Members

Figure 2:
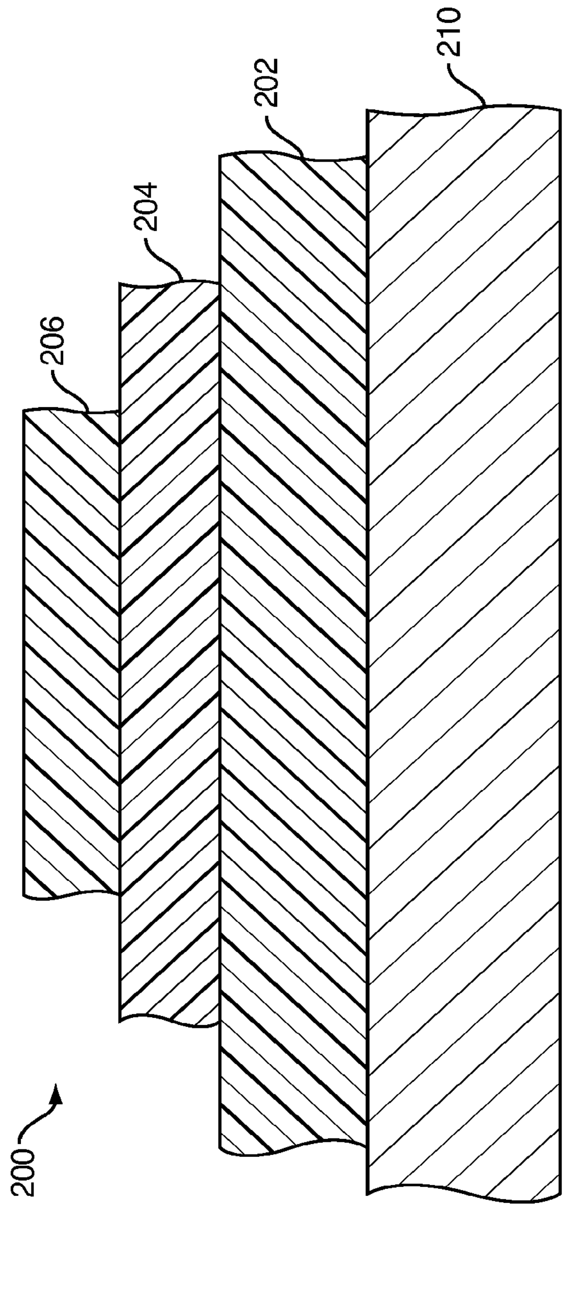
FIG. 2 is an enlarged cross-sectional view of a printing member according to the invention.

FIG. 2 illustrates a negative-working printing member 200 according to the present invention that includes a substrate 202, a polymeric imaging layer 204, and a topmost layer 206. Layer 204 is sensitive to imaging (generally IR) radiation as discussed below, and imaging of the printing member 200 (by exposure to IR radiation) results in imagewise ablation of the layer 204. The resulting de-anchorage of topmost layer 206 facilitates its removal by rubbing or simply as a result of contact during the print "make ready" process. Preferably, the ablation debris of layer 204 is chemically compatible with water in the sense of being acted upon, and removed by, an aqueous liquid following imaging.

Substrate 202 (or a layer thereover) exhibits a lithographic affinity opposite that of topmost layer 206. Consequently, ablation of layer 204, followed by imagewise removal of the topmost layer 206 to reveal an underlying layer or the substrate 202, results in a lithographic image.

Most of the films used in the present invention are "continuous" in the sense that the underlying surface is completely covered with a uniform layer of the deposited material.

Each of these layers and their functions is described in detail below.

2.1 Substrate 202

The substrate provides dimensionally stable mechanical support to the printing member. The substrate should be strong, stable, and flexible. One or more surfaces (and, in some cases, bulk components) of the substrate may be hydrophilic. The topmost surface, however, is generally oleophilic. Suitable materials include, but are not limited to, polymers, metals and paper, but generally, it is preferred to have a polymeric ink-accepting layer (e.g., applied over a metal or paper support). As used herein, the term "substrate" refers generically to the ink-accepting layer beneath the radiation-sensitive layer 204, although the substrate may, in fact, include multiple layers (e.g., an oleophilic film laminated to an optional metal support 210, such as an aluminum sheet having a thickness of at least 0.001 inch, or an oleophilic coating over an optional paper support).

Substrate 202 desirably also exhibits high scattering with respect to imaging radiation. This allows full utilization of the radiation transmitted through overlying layers, as the scattering causes back-reflection into layer 204 and consequent increases in thermal efficiency.

Polymers suitable for use in substrates according to the invention include, but are not limited to, polyesters (e.g., polyethylene terephthalate and polyethylene naphthalate), polycarbonates, polyurethane, acrylic polymers, polyamide polymers, phenolic polymers, polysulfones, polystyrene, and cellulose acetate. A preferred polymeric substrate is polyethylene terephthalate film, such as the polyester films available from DuPont-Teijin Films, Hopewell, Va. under the trademarks MYLAR and MELINEX, for example. Also suitable are the white polyester products from DuPont-Teijin such as MELINEX 927W, 928W 329, 329S, 331.

Polymeric substrates can be coated with a hard polymer transition layer to improve the mechanical strength and durability of the substrate and/or to alter the hydrophilicity or oleophilicity of the surface of the substrate. Ultraviolet or electron-beam cured acrylate coatings, for example, are suitable for this purpose. Polymeric substrates can have thicknesses ranging from about 50 μm to about 500 μm or more, depending on the specific printing member application. For printing members in the form of rolls, thicknesses of about 200 μm are preferred. For printing members that include transition layers, polymer substrates having thicknesses of about 50 μm to about 100 μm are preferred.

2.2 Layer 204

The layer 204 can be any polymer capable of stably retaining, at the applied thickness, an IR-absorptive pigment dispersion (generally nonconductive carbon black) adequate to cause ablation of the layer in response to an imaging pulse; and of exhibiting water compatibility following ablation. Furthermore, in embodiments where layer 204 is only partially ablated, it is either (a) sufficiently water-compatible to be fully removed during cleaning, or (b) oleophilic if some of layer remains even after cleaning. It is found that the nonconductive carbon black enhances, or even confers, the desired water compatibility of layer 204 or the ablation debris thereof. Layer 204 should exhibit good adhesion to the overlying layer 206, and resistance to age-related degradation may also be considered.

In general, pigment loading levels are at least 25 wt %, and the coating is applied at a dry weight of at least 0.2 $g/m^2$, or at least 0.4 $g/m^2$, or at least 0.8 $g/m^2$, or at least 1.0 $g/m^2$, or in some embodiments, at least 1.5 $g/m^2$. Representative materials include BAKELITE (phenol formaldehyde) and other phenolic resins, vinyl chloride resins, acrylic resins, and/or polyvinyl butyral.

Other suitable materials include polymers formed from maleic anhydride and one or more styrenic monomers (that is, styrene and styrene derivatives having various substituents on the benzene ring), polymers formed from methyl methacrylate and one or more carboxy-containing monomers, and mixtures thereof. These polymers can comprise recurring units derived from the noted monomers as well as recurring units derived from additional, but optional, monomers (e.g., (meth)acrylates, (meth)acrylonitrile and (meth)acrylamides). The carboxy-containing recurring units can be derived, for example, from acrylic acid, methacrylic acid, itaconic acid, maleic acid, and similar monomers known in the art. Other suitable materials include polymer binders having pendant epoxy groups. Particularly useful polymers of this type have pendant epoxy groups attached to the polymer backbone through a carboxylic acid ester group such as a substituted or unsubstituted —C(O)O-alkylene, —C(O)O-alkylene-phenylene-, or —C(O)O-phenylene group wherein the alkylene has 1 to 4 carbon atoms. Preferred ethylenically unsaturated polymerizable monomers having pendant epoxy groups useful to make these polymer binders include glycidyl acrylate, glycidyl methacrylate, 3,4-epoxycyclohexyl methacrylate, and 3,4-epoxycyclohexyl acrylate. The epoxy-containing polymers can also comprise recurring units derived from one or more ethylenically unsaturated polymerizable monomers that do not have pendant epoxy groups including but not limited to, (meth)acrylates, (meth)acrylamides, vinyl ether, vinyl esters, vinyl ketones, olefins, unsaturated imides (such as maleimide), N-vinyl pyrrolidones, N-vinyl carbazole, vinyl pyridines, (meth)acrylonitriles, and styrenic monomers. Of these, the (meth)acrylates, (meth)acrylamides, and styrenic monomers are preferred and the styrenic monomers are most preferred. For example, a styrenic monomer could be used in combination with methacrylamide, acrylonitrile, maleimide, vinyl acetate, or N-vinyl pyrrolidone.

Other useful materials include polyvinyl acetals, (meth) acrylic resins comprising carboxy groups, vinyl acetate crotonate-vinyl neodecanoate copolymer phenolic resins, maleated wood rosins, styrene-maleic anhydride co-polymers, (meth)acrylamide polymers, polymers derived from an N-substituted cyclic imide, and combinations thereof. Particularly useful materials include polyvinyl acetals, and copolymers derived from an N-substituted cyclic imide (especially N-phenylmaleimide), a (meth)acrylamide (especially methacrylamide), and a (meth)acrylic acid (especially methacrylic acid). The preferred polymeric materials of this type are copolymers that comprise from about 20 to about 75 mol % and preferably about 35 to about 60 mol % of recurring units derived from N-phenylmaleimide, N-cyclohexylmaleimide, N-benzylmaleimide, or a mixture thereof; from about 10 to about 50 mol % and preferably from about 15 to about 40 mol % of recurring units derived from acrylamide, methacrylamide, or a mixture thereof; and from about 5 to about 30 mol % and preferably about 10 to about 30 mol % of recurring units derived from methacrylic acid. Other hydrophilic monomers, such as hydroxyethyl methacrylate, may be used in place of some or all of the methacrylamide. Other alkaline-soluble monomers, such as acrylic acid, may be used in place of some or all of the methacrylic acid.

Other suitable polymeric materials include resins having activated methylol and/or activated alkylated methylol groups. Such resins include, for example, resole resins and their alkylated analogs, methylol melamine resins and their alkylated analogs (e.g., melamine-formaldehyde resins), methylol glycoluril resins and alkylated analogs (e.g., glycoluril-formaldehyde resins), thiourea-formaldehyde resins, guanamine-formaldehyde resins, and benzoguanamine-formaldehyde resins. Commercially available melamine-formaldehyde resins and glycoluril-formaldehyde resins include, for example, CYMEL resins (Dyno Cyanamid) and NIKALAC resins (Sanwa Chemical). The resin having activated methylol and/or activated alkylated methylol groups is preferably a resole resin or a mixture of resole resins. Resole resins are well known to those skilled in the art. They are prepared by reaction of a phenol with an aldehyde under basic conditions using an excess of phenol. Commercially available resole resins include, for example, GP649D99 resole (Georgia Pacific).

2.3 Topmost Layer 206

The topmost layer participates in printing and provides the requisite lithographic affinity difference with respect to substrate 202. In addition, the topmost layer 206 may help to control the imaging process by modifying the heat dissipation characteristics of the printing member at the air-imaging layer interface. Topmost layer is substantially (i.e., >90%) transparent to imaging radiation.

In dry-plate embodiments, suitable materials for topmost layer 110 include silicone polymers, fluoropolymers, and fluoro-silicone polymers. Silicone polymers are based on the repeating diorganosiloxane unit $(R_2SiO)_n$, where R is an organic radical or hydrogen and n denotes the number of units in the polymer chain. Fluorosilicone polymers are a particular type of silicone polymer wherein at least a portion of the R groups contain one or more fluorine atoms. The physical properties of a particular silicone polymer depend upon the length of its polymer chain, the nature of its R groups, and the terminal groups on the end of its polymer chain. Any suitable silicone polymer known in the art may be incorporated into or used for the surface layer 206.

Silicone polymers are typically prepared by cross-linking (or "curing") diorganosiloxane units to form polymer chains. The resulting silicone polymers can be linear or branched. A number of curing techniques are well known in the art, including condensation curing, addition curing, moisture curing. In addition, silicone polymers can include one or more additives, such as adhesion modifiers, rheology modifiers, colorants, and radiation-absorbing pigments, for example. Other options include silicone acrylate monomers, i.e., modified silicone molecules that incorporate "free radical" reactive acrylate groups or "cationic acid" reactive epoxy groups along and/or at the ends of the silicone polymer backbone. These are cured by exposure to ultraviolet (UV) and electron radiation sources. This type of silicone polymer can also include additives such as adhesion promoters, acrylate diluents, and multifunctional acrylate monomer to promote abrasion resistance, for example.

Examples of suitable fluoropolymers include polytetrafluoroethylene (PTFE), perfluoroalkoxy (PFA), fluorinated ethylene propylene (FEP), ethylene tetrafluoroethylene (ETFE), polytetrafluoroethylene perfluoromethylvinylether (MFA), or tetrafluoroethylene hexafluoropropylene vinylidene (THV). Any suitable fluoropolymer known in the art may be incorporated into or used for the surface layer 110.

In wet-plate embodiments, suitable materials for topmost layers 206 include hydrophilic polymers, such as polyalkyl ethers, polyhydroxyl compounds, and polycarboxylic acids, or oleo. For example, a hydrophilic topmost layer may include a fully hydrolyzed polyvinyl alcohol (e.g., CELVOL 305, 325 and 425 sold by Celanese Chemicals, Ltd. Dallas, Tex.), which are usually manufactured by hydrolysis of polyvinyl acetates. The use of fully hydrolyzed alcohol is preferred to assure that residual non-hydrolyzed acetate does not affect the hydrophilic behavior of the surface. The presence of residual polyvinyl acetate moieties in the topmost layer promotes interaction of the non-image areas of the printing member with printing inks, which can diminish print quality.

Topmost layers are typically applied between 0.05 and 2.5 $g/m^2$ using coating techniques known in the art, such as wire-wound rod coating, reverse roll coating, gravure coating, or slot die coating. For example, in particular embodiments, the topmost layer is applied using a wire-round rod, followed by drying in a convection oven. In various embodiments, the topmost layer is applied between 0.2 and 2.5 $g/m^2$, e.g., 1.0 to 2.0 $g/m^2$. In one embodiment, the topmost layer is applied between 0.2 and 0.9 $g/m^2$ to create a process-free printing member. Applications from 1.0 to 2.5 g/$m^2$ create a more durable printing member, but these generally require a mild processing such as water rinse and wipe prior to press use.

3. Imaging Apparatus

An imaging apparatus suitable for use in conjunction with the present printing members includes at least one laser device that emits in the region of maximum plate responsiveness, i.e., whose $\lambda_{max}$ closely approximates the wavelength region where the plate absorbs most strongly. Specifications for lasers that emit in the near infrared (IR) region are fully described in the '512 patent and U.S. Pat. No. 5,385,092 ("the '092 patent"), the entire disclosures of which are hereby incorporated by reference. Lasers emitting in other regions of the electromagnetic spectrum are well-known to those skilled in the art.

Suitable imaging configurations are also set forth in detail in the '512 and '092 patents. Briefly, laser output can be provided directly to the plate surface via lenses or other beam-guiding components, or transmitted to the surface of a blank printing plate from a remotely sited laser using a fiber-optic cable. A controller and associated positioning hardware maintain the beam output at a precise orientation with respect to the plate surface, scan the output over the surface, and activate the laser at positions adjacent selected points or areas of the plate. The controller responds to incoming image signals corresponding to the original document or picture being copied onto the plate to produce a precise negative or positive image of that original. The image signals are stored as a bitmap data file on a computer. Such files may be generated by a raster image processor ("RIP") or other suitable means. For example, a RIP can accept input data in page-description language, which defines all of the features required to be transferred onto the printing plate, or as a combination of page-description language and one or more image data files. The bitmaps are constructed to define the hue of the color as well as screen frequencies and angles.

Other imaging systems, such as those involving light valving and similar arrangements, can also be employed; see, e.g., U.S. Pat. Nos. 4,577,932; 5,517,359; 5,802,034; and 5,861,992, the entire disclosures of which are hereby incorporated by reference. Moreover, it should also be noted that image spots may be applied in an adjacent or in an overlapping fashion.

The imaging apparatus can operate on its own, functioning solely as a platemaker, or can be incorporated directly into a lithographic printing press. In the latter case, printing may commence immediately after application of the image to a blank plate, thereby reducing press set-up time considerably. The imaging apparatus can be configured as a flatbed recorder or as a drum recorder, with the lithographic plate blank mounted to the interior or exterior cylindrical surface of the drum. Obviously, the exterior drum design is more appropriate to use in situ, on a lithographic press, in which case the print cylinder itself constitutes the drum component of the recorder or plotter.

In the drum configuration, the requisite relative motion between the laser beam and the plate is achieved by rotating the drum (and the plate mounted thereon) about its axis and moving the beam parallel to the rotation axis, thereby scanning the plate circumferentially so the image "grows" in the axial direction. Alternatively, the beam can move parallel to the drum axis and, after each pass across the plate, increment angularly so that the image on the plate "grows" circumferentially. In both cases, after a complete scan by the beam, an image corresponding (positively or negatively) to the original document or picture will have been applied to the surface of the plate.

In the flatbed configuration, the beam is drawn across either axis of the plate, and is indexed along the other axis after each pass. Of course, the requisite relative motion between the beam and the plate may be produced by movement of the plate rather than (or in addition to) movement of the beam. Examples of useful imaging devices include models of the TRENDSETTER imagesetters (available from Eastman Kodak Company) that utilize laser diodes emitting near-IR radiation at a wavelength of about 830 nm. Other suitable exposure units include the CRESCENT 42T Platesetter (operating at a wavelength of 1064 nm, available from Gerber Scientific, Chicago, Ill.) and the SCREEN PLATERITE 4300 series or 8600 series plate-setter (available from Screen, Chicago, Ill.).

Regardless of the manner in which the beam is scanned, in an array-type system for on-press applications it is generally preferable to employ a plurality of lasers and guide their outputs to a single writing array. The writing array is then indexed, after completion of each pass across or along the plate, a distance determined by the number of beams emanating from the array, and by the desired resolution (i.e., the number of image points per unit length). Off-press applications, which can be designed to accommodate very rapid scanning (e.g., through use of high-speed motors, mirrors, etc.) and thereby utilize high laser pulse rates, can frequently utilize a single laser as an imaging source.

4. Imaging and Printing

When exposed to an imaging pulse, the exposed area of layer 204 absorbs the imaging pulse and converts it to heat. The heat builds up until the layer 204 ablates. After imaging, the topmost layer 206 is de-anchored in the areas that received imaging radiation. The exposed areas that contain ablation debris are purged of the debris prior to printing Because the ablation debris generated by layer 204 is water-compatible, in some embodiments, the debris is removed during print "make ready." Otherwise, the printing member may be subjected to the action of an aqueous liquid by manual or mechanical means. The aqueous liquid may consist essentially of water, e.g., it may be plain tap water. Alternatively, the aqueous liquid may comprise water and not more than 20% (or not more than 15%) by weight of an organic solvent, e.g., an alcohol. The alcohol may be a glycol (e.g., propylene glycol), benzyl alcohol and/or phenoxyethanol. In some embodiments, the aqueous liquid may comprise a surfactant. The aqueous liquid may be heated to a temperature greater than about 80° F. prior to being applied to the imaged printing member.

Water-miscible solvents that may be present include, but are not limited to, the reaction products of phenol with ethylene oxide and propylene oxide such as ethylene glycol phenyl ether (phenoxyethanol), esters of ethylene glycol and of propylene glycol with acids having six or fewer carbon atoms, and ethers of ethylene glycol, diethylene glycol, and of propylene glycol with alkyl groups having six or fewer carbon atoms, such as 2-ethoxyethanol and 2-butoxyethanol. A single organic solvent or a mixture of organic solvents can be used. By "water-miscible" is meant that the organic solvent or mixture of organic solvents is either miscible with water or sufficiently soluble in the aqueous liquid that phase separation does not occur.

The aqueous liquid may be an aqueous solution having a pH greater than 2 and up to about 11, and typically from about 6 to about 11, or from about 6 to about 10.5, as adjusted using a suitable amount of an acid or base. The viscosity of the processing solution can be adjusted to a value of from about 1.7 to about 5 cP by adding a suitable amount of a viscosity-increasing compound such as a poly(vinyl alcohol) or poly (ethylene oxide).

As noted above, the aqueous liquid may include one or more surfactants. Useful anionic surfactants include those with carboxylic acid, sulfonic acid, or phosphonic acid groups (or salts thereof). Anionic surfactants having sulfonic acid (or salts thereof) groups are particularly useful. For example, anionic surfactants can include aliphates, abietates, hydroxyalkanesulfonates, alkanesulfonates, dialkylsulfosuccinates, alkyldiphenyloxide disulfonates, straight-chain alkylbenzenesulfonates, branched alkylbenzenesulfonates, alkylnaphthalenesulfonates, alkylphenoxypolyoxyethylenepropylsulfonates, salts of polyoxyethylene alkylsulfonophenyl ethers, sodium N-methyl-N-oleyltaurates, monoamide disodium N-alkylsulfosuccinates, petroleum sulfonates, sulfated castor oil, sulfated tallow oil, salts of sulfuric esters of aliphatic alkylester, salts of alkylsulfuric esters, sulfuric esters of polyoxy-ethylene alkylethers, salts of sulfuric esters of aliphatic monoglucerides, salts of sulfuric esters of polyoxyethylenealkylphenylethers, salts of sulfuric esters of polyoxyethylenestyrylphenylethers, salts of alkylphosphoric esters, salts of phosphoric esters of polyoxyethylenealkylethers, salts of phosphoric esters of polyoxyethylenealkylphenylethers, partially saponified compounds of styrene-maleic anhydride copolymers, partially saponified compounds of olefin-maleic anhydride copolymers, and naphthalenesulfonateformalin condensates. Alkyldiphenyloxide disulfonates (such as sodium dodecyl phenoxy benzene disulfonates), alkylated naphthalene sulfonic acids, sulfonated alkyl diphenyl oxides, and methylene dinaphthalene sulfonic acids) are particularly useful as the primary anionic surfactant. Such surfactants can be obtained from various suppliers as described in McCutcheon's Emulsifiers & Detergents, 2007 Edition.

Particular examples of useful anionic surfactants include, but are not limited to, sodium dodecylphenoxyoxybenzene disulfonate, the sodium salt of alkylated naphthalenesulfonate, disodium methylene-dinaphthalene disulfonate, sodium dodecylbenzenesulfonate, sulfonated alkyl-diphenyloxide, ammonium or potassium perfluoroalkylsulfonate and sodium dioctylsulfosuccinate. The one or more anionic surfactants can be generally present in an amount of at least 1 wt % (% solids), and typically from about 5 wt % up to about 45%, e.g., up to about 30 weight %. In some embodiments, the one or more anionic surfactants can be present in an amount of from about 8 to about 20 wt %.

The aqueous liquid may optionally include one or more nonionic surfactants. Particularly useful nonionic surfactants include MAZOL PG031-K (a triglycerol monooleate, TWEEN 80 (a sorbitan derivative), PLURONIC L62LF (a block copolymer of propylene oxide and ethylene oxide), and ZONYL FSN (a fluorocarbon), and/or a nonionic surfactant for successfully coating the processing solution onto the printing plate surface, such as a nonionic polyglycol. These nonionic surfactants can be present in an amount of up to 10 wt %, but usually at less than 2 wt %.

Printing with the printing member includes applying ink to at least a portion of the printing member, preferably the oleophilic exposed areas. The ink is transferred in the imagewise lithographic pattern (created as described above) to a recording medium such as paper. The inking and transferring steps may be repeated a desired number of times, e.g., the approximately 5,000 to approximately 20,000 times in a low to medium printing run.

EXAMPLES

Examples 1 and 2

Waterless printing plates in accordance with the invention generally include a carbon-polymer composite imaging layer 204 and an oleophobic top layer 206 disposed on a polyester substrate 202. A preferred substrate is a 175 μm white polyester film sold by DuPont Teijin Films (Hopewell, Va.) labeled MELINEX 331.

Suitable formulations for the carbon-polymer imaging layer are described below.

| | Parts | |
|---|---|---|
| Component | Example 1 | Example 2 |
| HRJ 12362 | 1.46 | 1.82 |
| Micropigmo AMBK-2 | 5.83 | — |
| Renol Black RH HW30 | — | 9.56 |
| Cymel 385 | 0.44 | 0.55 |
| Cycat 4040 | 0.44 | 0.55 |
| BYK 307 | 0.09 | 0.09 |
| Dowanol PM | 91.75 | 87.44 |

HRJ-12362 is a phenol formaldehyde thermosetting resin supplied as a 72 wt % solid in a 60% n-butanol solution by the SI Group, Inc. (Schenedtady, N.Y.). MICROPIGMO AMBK-2 is a 20% solids proprietary carbon dispersion supplied by Orient Corporation of America (Kenilworth, N.J.). RENOL BLACK R-HW 30 is a carbon black preparation available from Clariant International Ltd. (Switzerland) in a granular form with a low-viscosity polyvinyl butyral binder. CYMEL 385 is a methylated high imino melamine crosslinker supplied by Cytek industries, Inc. (West Paterson, N.J.). CYCAT 4040 is p-toluenesulfonic acid catalyst supplied as a 40% solution in isopropanol by Cytek Industries, Inc. BYK 307 is a polyether-modified polydimethylsiloxane surfactant supplied by BYK Chemie (Wallingford, Conn.). The solvent, DOWANOL PM, is propylene glycol methyl ether available from the Dow Chemical Company (Midland, Mich.).

The coating solutions were applied to the substrate using a wire-round rod and then dried and cured at 178° C. for one minute to produce dried coatings of about 1.0 g/m$^2$. The oleophobic silicone top layer of the plate members was subsequently applied to the dried carbon layer. Suitable formulations well known and described in, for example, U.S. Pat. No. 5,212,048 (the entire disclosure of which is hereby incorporated by reference).

| Component | Supplier | Parts |
|---|---|---|
| PLY 7500P | Nusil Silicone Technology, Charlotte, NC | 8.55 |
| DC Syl-off 7367 | Univar USA Inc., Atlanta, GA | 0.37 |
| CPC072 | Umicore Precious Metals, S. Plainfield, NJ | 0.12 |
| Heptane | Houghton Chemicals, Allston, MA | 90.96 |

The resulting formulation was applied with a wire-round rod and dried and cured at 138° C. for about one minute to provide a coating of about 1.1 g/m$^2$.

The plates were imaged and cleaned on-press on a Presstek 34DI digital offset printing press. Imaging was carried out with Presstek's PROFIRE EXCEL imaging head at a power of about 300 mJ/$cm^2$. Once imaging was completed, the plate was cleaned in a two-step automatic cleaning process involving rubbing against a dry roller and a towel impregnated with a glycol solution.

Plates made as set forth above, and having image patterns susceptible to discharge problems, were selected for testing. These were run on-press under conditions guaranteed to produce ESD events (Using Wero D403-13 ink rubber rollers manufactured by Westland Gummiwerke GmbH & Co. (Germany)). The plates were run under these conditions for more than 1,000 impressions, and the resulting printed images did not show any sign of ESD defects. (Presstek's PEARLDRY product, which contains a metal imaging layer, was run under the same conditions and displayed ESD defects from the start of the press run; these worsened over time.)

Other parameters considered during the evaluation of a printing plate are durability and environmental stability. These were tested in the laboratory by assessing adhesion (using a X-hatch adhesive test) and solvent resistance (using MEK and heptane rubs) of fresh plates stored at ambient conditions and plates aged in an environmental chamber at 80° C. and 75% RH for 18 hours. In the adhesive test, adhesion of the silicone coating to the metal layer is evaluated, visually and by optical-microscopy inspection, to determine whether the silicone coating can be removed with adhesive tape. The MEK test involves evaluation of silicone loss after applying MEK rubs using a five-pound load under reciprocation on a surface of about 20 cm in length; the cycle is repeated to the point of visual evidence failure. The heptane test involves evaluation of silicone loss after applying 10 heptane rubs using a five-pound load under reciprocation on a surface of about 20 cm in length.

The results of these test carried out on the plates of Examples 1 and 2, and the standard PEARLDRY plate, are summarized in the following table.

| | Plate Stored @ Standard Conditions | | | Aged Plate | |
|---|---|---|---|---|---|
| Sample | X-hatch Test | MEK | Heptane | MEK | Heptane |
| Pearldry | Pass | 10-15 | Pass | 10-15 | Pass |
| Example 1 | Pass | >50 | Pass | >50 | Pass |
| Example 2 | Pass | >50 | Pass | >50 | Pass |

The laboratory test shows that the plates of Examples 1 and 2 display excellent wear and solvent resistance, which is not affected by exposure to extreme high temperature and humidity conditions.

Examples 3-5

Plates similar to those of Example 2 were prepared using carbon imaging formulations with different polymer co-binder resins. Formulation examples are given below for carbon layers made with the RENOL BLACK RH-HW30 carbon dispersion, but the MICROPIGMO AMBK-2 dispersion could also have been used.

| | Parts | | |
|---|---|---|---|
| Component | Example 3 | Example 4 | Example 5 |
| Vinnol E-15/48A | 1.82 | — | — |
| Novolak P2 | — | 1.82 | — |
| Acryloid B-44 | — | — | 1.82 |
| Renol Black RH HW30 | 9.56 | 9.56 | 9.56 |
| Cymel 385 | 0.55 | 0.55 | 0.55 |
| Cycat 4040 | 0.55 | 0.55 | 0.55 |
| BYK 307 | 0.09 | 0.09 | 0.09 |
| Dowanol PM | 87.66 | 87.66 | 87.66 |

VINNOL E-15/48A is a vinyl chloride coating resin with hydroxyl functional groups available from Wacker Chemie AG (Germany). NOVOLAK P2 is an o-cresol and p-cresol phenolic resin supplied by Diversitec Corporation (Fort Collins, Colo.). ACRYLOID B-44 is a solid thermoplastic acrylic resin available from Rhom and Haas (Philadelphia, Pa.).

These carbon formulations were applied with a wire-round rod and dried and cured at 178° C. for about one minute to provide a coating of about 1.0 g/$m^2$. Next, the silicone formulation given in the previous examples was applied.

Plates in accordance with these formulations were imaged, cleaned, and tested on press as described in Examples 1 and 2. The resulting printing members ran without exhibiting any ESD-related defects.

Example 6

In this example, the carbon and silicone layers as described in Example 1 were applied as described above onto a 200 μm (0.008 inch) anodized aluminum alloy (Alcoa, Pittsburgh, Pa.). The alloy was electrochemically etched and anodized to provide an anodic layer with Ra values in the order of 0.300 μm.

The plate was imaged, cleaned and ran on a Presstek 34 DI digital offset printing press as described in Examples 1 and 2. The cleaning process allows for complete removal of the silicone layer and partial removal of the carbon-loaded imaging layer in the exposed areas of the plate. Any residual carbon left on the exposed areas enhances the ink receptivity of the image areas of the plate. This printing member was run for more than 1,000 impressions without showing any ESD defects.

Example 7

The approach of Example 1 was utilized on a thin (50 μm) polyester substrate, which was laminated to a 150 μm coil of aluminum 3103 alloy (Alcoa, Pittsburgh, Pa.). Lamination was performed using a 100% solids acrylate adhesive formulation supplied by DynaTech Adhesives & Coatings (Grafton, W. Va.), which is cured with an e-beam radiation source. This embodiment is intended to expand the use of printing members made on polyester substrates to platemaker applications. The aluminum base facilitates handling of the plate (principally preventing stretching on-press).

Example 8

A plate made in accordance with Example 1 was imaged off-press and cleaned with water in a plate washer. Specifically, the plate was imaged on a KODAK TRENDSETTER image setter at a power of 300 mJ/$cm^2$, and cleaned automatically on a KP 650/860 S-CH plate washer from Konings (Germany). In this machine, the plates are cleaned with tap water at about 90° F. by means of two roller brushes that rotate and move up and down continuously. The plate processor was operated at a throughput speed of 1.9 feet/min and using a brush speed of 500 rpm.

The cleaned plate was run on a GTO Heidelberg press using black ink and uncoated stock. Under these conditions the printing member was run for 40,000 impressions with no signs of wear or scratch failure.

Example 9

A plate in accordance with Example 6 was imaged off-press and cleaned with water in a plate washer. The plate was imaged on a KODAK TRENDSETTER image setter using a power of 350 mJ/cm$^2$ and cleaned on the KPH65/860 S-CH Konings plate washer described in Example 8. The plate was run on a GTO Heidelberg press for more than 50,000 impressions.

Example 10

The carbon image layer formulation given below was applied to 200 μm (0.008 inch) coil of anodized aluminum alloy (Alcoa, Pittsburgh, Pa.) using a wire-round rod and then dried and cured at 178° C. for one minute to produce dried coatings of about 0.75 g/m$^2$.

| Component | Parts |
|---|---|
| HRJ 12362 | 1.00 |
| Micropigmo AMBK-2 | 7.00 |
| Cymel 385 | 0.40 |
| Cycat 4040 | 0.40 |
| BYK 307 | 0.10 |
| Dowanol PM | 91.1 |

The oleophobic silicone top layer was subsequently applied to the dried carbon-containing layer as described in previous examples. The resulting plate was imaged on a KODAK TRENDSETTER image setter at the lowest acceptable exposure of 270 mJ/cm$^2$ and cleaned automatically with water at 90° F. on a KP 650/860 S-CH plate washer from Konings, as described in Example 8.

The cleaned plate was run on a GTO Heidelberg press for 40,000 impression using black ink and uncoated stock.

Example 11

A plate made in accordance with Example 1 was imaged off-press on a KODAK TRENDSETTER image setter at a power of 300 mJ/cm$^2$ and cleaned automatically on the Aquascrubber AS34(E) plate washer manufactured by NES Worldwide Inc. (Westfield, Mass.). In this machine, the plates are cleaned with tap warm water (90° F.) by means of rotary scrub rollers.

The cleaned plate was run on a GTO Heidelberg press to at least 2,000 impressions using black ink and uncoated stock.

Example 12

A plate made in accordance with Example 1 was imaged off-press on a KODAK TRENDSETTER image setter at a power of 300 mJ/cm$^2$ and manually cleaned at room temperature with the HP-7N manual developer from Toray International America (New York, N.Y.).

The cleaned plate was run on a GTO Heidelberg press to at least 2,000 impression using black ink and uncoated stock.

Example 13

A plate made in accordance with Example 1 was imaged off-press on a KODAK TRENDSETTER image setter at a power of 300 mJ/cm$^2$ and cleaned in a two-step process. In the first step, the plate was presoaked for two minutes in a diluted water solution (one part to four) of the DP-1 CTP machine pretreatment solution from Toray (Toray International America, NY). In the second step, the plate was water-cleaned on the automatic KP 650/860 S-CH plate washer from Konings (Germany). The plate processor was operated with tap water at about 90° F. and at a throughput of 1.9 feet/min.

The cleaned plate was run on a GTO Heidelberg press for at least 2,000 impression using black ink and uncoated stock.

Although the present invention has been described with reference to specific details, it is not intended that such details should be regarded as limitations upon the scope of the invention, except as and to the extent that they are included in the accompanying claims.

What is claimed is:

1. A method of imaging a lithographic printing member, the method comprising the steps of:

(a) providing a lithographic printing member comprising (i) a first layer presenting a hydrophilic or oleophobic lithographic affinity, (ii) a second layer comprising a polymeric matrix and, dispersed therein, nonconductive carbon black particles at a loading level sufficient to provide at least partial layer ablatability, and (iii) a third layer presenting an oleophilic lithographic affinity, the second layer being disposed between the first and third layers;

(b) exposing the printing member to imaging radiation in an imagewise pattern so as to at least partially ablate the second layer where exposed and thereby de-anchor the first layer therefrom; and (c) subjecting the printing member to an aqueous liquid to remove imaged portions of the second layer, thereby creating an imagewise lithographic pattern on the printing member.

2. The method of claim 1 wherein the aqueous liquid consists essentially of water.

3. The method of claim 2 wherein the aqueous liquid is plain tap water.

4. The method of claim 1 wherein the aqueous liquid comprises water and not more than 20% by weight of an organic solvent.

5. The method of claim 4 wherein the aqueous liquid comprises not more than 15% by weight of an organic solvent.

6. The method of claim 4 wherein the solvent is an alcohol.

7. The method of claim 6 wherein the alcohol is a glycol.

8. The method of claim 6 wherein the alcohol is at least one of propylene glycol, benzyl alcohol or phenoxyethanol.

9. The method of claim 1 wherein the aqueous liquid comprises a surfactant.

10. The method of claim 1 wherein the aqueous liquid is heated to a temperature greater than about 80° F.

11. A method of lithographic printing, the method comprising the steps of:

(a) providing a lithographic printing member comprising (i) a first layer presenting an oleophobic lithographic affinity, (ii) a second layer comprising a polymeric matrix and, dispersed therein, nonconductive carbon black particles at a loading level sufficient to provide at least partial layer ablatability, and (iii) a third layer presenting an oleophilic lithographic affinity, the second layer being disposed between the first and third layers;

(b) exposing the printing member to imaging radiation in an imagewise pattern so as to at least partially ablate the second layer where exposed and thereby de-anchor the first layer therefrom;

(c) subjecting the printing member to an aqueous liquid to remove imaged portions of the second layer, thereby creating an imagewise lithographic pattern on the printing member;

(d) following the removal step, applying ink to the printing member, the ink adhering only to imaged portions of the printing member; and (e) transferring the applied ink from the printing member to a recording medium, wherein the applying and transferring step occur without deleterious buildup of triboelectric charge.

* * * * *